United States Patent
Tang

(10) Patent No.: US 8,385,016 B1
(45) Date of Patent: Feb. 26, 2013

(54) ASYMMETRIC CORRECTION CIRCUIT

(75) Inventor: Qiang Tang, Cupertino, CA (US)

(73) Assignee: Marvell International, Inc., Hamilton (BM)

(*) Notice: Subject to any disclaimer, the term of this patent is extended or adjusted under 35 U.S.C. 154(b) by 189 days.

(21) Appl. No.: 12/909,675

(22) Filed: Oct. 21, 2010

Related U.S. Application Data

(60) Provisional application No. 61/258,148, filed on Nov. 4, 2009.

(51) Int. Cl.
*G11B 5/02* (2006.01)
*G11B 5/09* (2006.01)
*H03F 3/45* (2006.01)

(52) U.S. Cl. ............... 360/67; 360/46; 330/254

(58) Field of Classification Search .................. None
See application file for complete search history.

(56) References Cited

U.S. PATENT DOCUMENTS

| | | | |
|---|---|---|---|
| 7,242,545 B1 | 7/2007 | Cheng | |
| 2006/0256463 A1* | 11/2006 | Ozdemir | 360/46 |
| 2009/0140803 A1* | 6/2009 | Aram et al. | 330/98 |

* cited by examiner

*Primary Examiner* — Regina N Holder

(57) ABSTRACT

In one embodiment, an apparatus includes an amplifier configured to receive an asymmetric signal. Correction control circuitry is configured to control gain control circuitry based on the asymmetrical signal to adjust a gain of the amplifier to correct the asymmetric signal. A first adjustment of the gain control circuitry is performed during a first interval and a second adjustment of the gain control circuitry is performed during a second interval to correct the asymmetric signal.

22 Claims, 7 Drawing Sheets

ASYMMETRIC CORRECTION CIRCUIT

CROSS REFERENCE TO RELATED APPLICATIONS

The present disclosure claims priority to U.S. Provisional App. No. 61/258,148 for "Asymmetry Correction Circuit for Read Channel" filed Nov. 4, 2009, which is incorporated herein by reference in its entirety for all purposes.

BACKGROUND

Particular embodiments generally relate to asymmetric correction circuits.

Unless otherwise indicated herein, the approaches described in this section are not prior art to the claims in this application and are not admitted to be prior art by inclusion in this section.

In a read channel for a hard disk drive, a signal received from a read head of the disk drive may be asymmetric. For better performance, the symmetry of the asymmetric signal should be corrected.

FIG. 1a depicts a graph 100 of an asymmetric signal 102 and ideal signal 104. Ideal signal 104 includes pulses in a period that have absolute peak amplitudes that are equal and asymmetric signal 102 has pulses that have unequal absolute peak amplitudes in the period. The correction of asymmetric signal 102 is performed to correct the asymmetry of asymmetric signal to be similar to the symmetry of ideal signal 104.

One way of correcting asymmetric signal 102 is to generate a square term that increases or decreases the amplitude of asymmetric signal 102. FIG. 1b depicts a graph showing the correction. A square term 106 is combined with asymmetric signal 102 to produce an output signal 108. However, an additional path and circuitry is needed to generate the square term.

Another way of correcting asymmetric signal 102 is to use extra current sources. FIG. 2 depicts an example of a circuit for correcting asymmetric signal 102 using signal currents IS1, IS2, and IS3. The output of circuit 200 is across resistors 208a and 208b. Resistors 208a and 208b are connected between signal currents IS1 and IS2, and voltage is supplied by a common mode voltage source, Vcom. The current is varied to correct asymmetric signal 102. For example, adding more current through resistors 208a and 208b increases the output voltage (e.g., the amplitude of asymmetric signal 102) while decreasing the current through resistors 208a and 208b decreases the output voltage.

The switching section includes two pair of high speed field effect transistors 210 (including transistors T1, T2) and 212 (including transistors T3, T4) for switching biasing current to the amplifier section 214. Each of the transistors T1, T2, T3, T4 can behave as a switch. These characteristics of the transistors T1, T2, T3, T4 cause biasing current to flow through only the transistors having a positive gate, and not through the transistors having a negative gate. Therefore, whichever transistors are conducting are passing all the current. The current is not shared by each of the transistors of the switching pair.

The amplifier section 214 is a differential amplifier comprising a pair of field effect transistors T5 and T6. The differential amplifier is responsive to the differential input signal, Vip and Vin, producing a differential current, $\delta_i$, proportional to the transconductance (or gain gm) of the transistor pair 214 times the differential signal input voltage Vip−Vin. Therefore, a positive differential current $\delta_i$ flows through transistor T5 and correspondingly, a negative differential current, $-\delta_i$ flows through transistor T6 when Vip is positive and Vin is negative. Conversely, when Vip is negative and Vip is positive, $-\delta_i$ flows in transistor T5 and $\delta_i$ flows in transistor T6. Also, when Vin is positive, transistors T1 and T4 are conducting causing a current of $2\times\delta_i$ to flow across the biasing resistors 208a and 208b. When Vin is positive, transistors T2 and T3 are conducting, also causing a current of $2\times\delta_i$, to flow across resistors 208a and 208b. Adding more current through resistors 208a and 208b increases the output voltage (e.g., the amplitude of asymmetric signal 102).

Although using current summing may correct the asymmetry of asymmetric signal 102, the use of current summing needs higher supply voltage due to stacking switches on top of the signal current path, and may cause higher power usage, higher current, and use more area on an integrated circuit (IC) chip.

SUMMARY

In one embodiment, an apparatus includes an amplifier configured to receive an asymmetric signal. Correction control circuitry is configured to control gain control circuitry based on the asymmetrical signal to adjust a gain of the amplifier to correct the asymmetric signal. A first adjustment of the gain control circuitry is performed during a first interval and a second adjustment of the gain control circuitry is performed during a second interval to correct the asymmetric signal.

In one embodiment, the gain control circuitry comprises input resistance circuitry and feedback resistance circuitry.

In one embodiment, the correction control circuitry adjusts a ratio of resistance between the input resistance circuitry to the feedback resistance circuitry.

In one embodiment, the first adjustment lowers an input resistance of the input resistance circuitry and the second adjustment lowers the feedback resistance of the feedback resistance circuitry.

In another embodiment, a system includes the apparatus and further includes a pre-amplifier configured to receive the asymmetrical signal from a read head of a hard disk drive, wherein the pre-amplifier is configured to send the asymmetric signal to the amplifier.

In another embodiment, a method includes: receiving an asymmetric signal at an amplifier; adjusting a gain of the amplifier to correct the asymmetric signal to produce a corrected signal, wherein a first adjustment of gain control circuitry is performed during a first half period and a second adjustment of the gain control circuitry is performed during a second half period to correct the asymmetric signal; and outputting the corrected signal.

In one embodiment, adjusting the gain comprises adjusting an input resistance and a feedback resistance.

The following detailed description and accompanying drawings provide a more detailed understanding of the nature and advantages of the present invention.

DETAILED DESCRIPTION

Described herein are techniques for asymmetric correction. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1A:
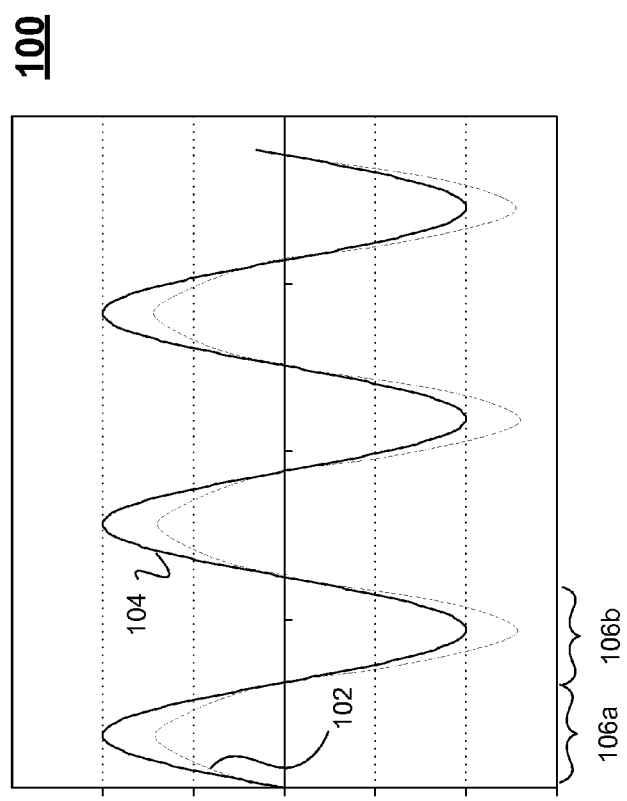
FIG. 1 depicts a graph of an asymmetric signal and an ideal signal.
Figure 1B:
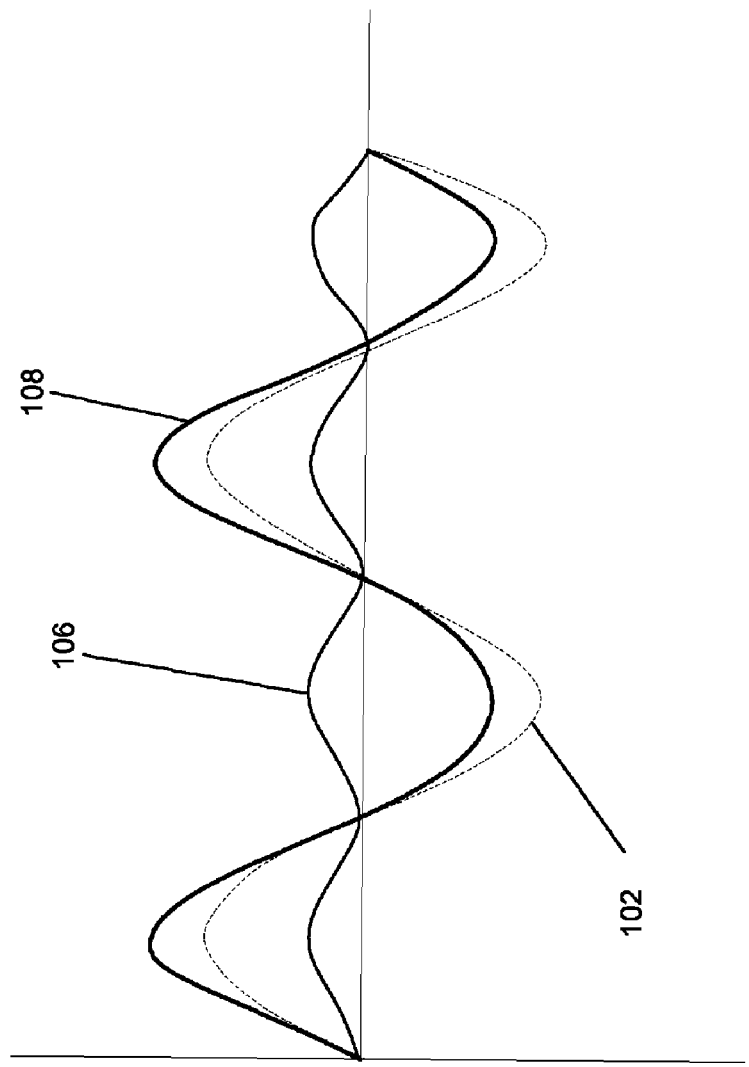
Figure 2:
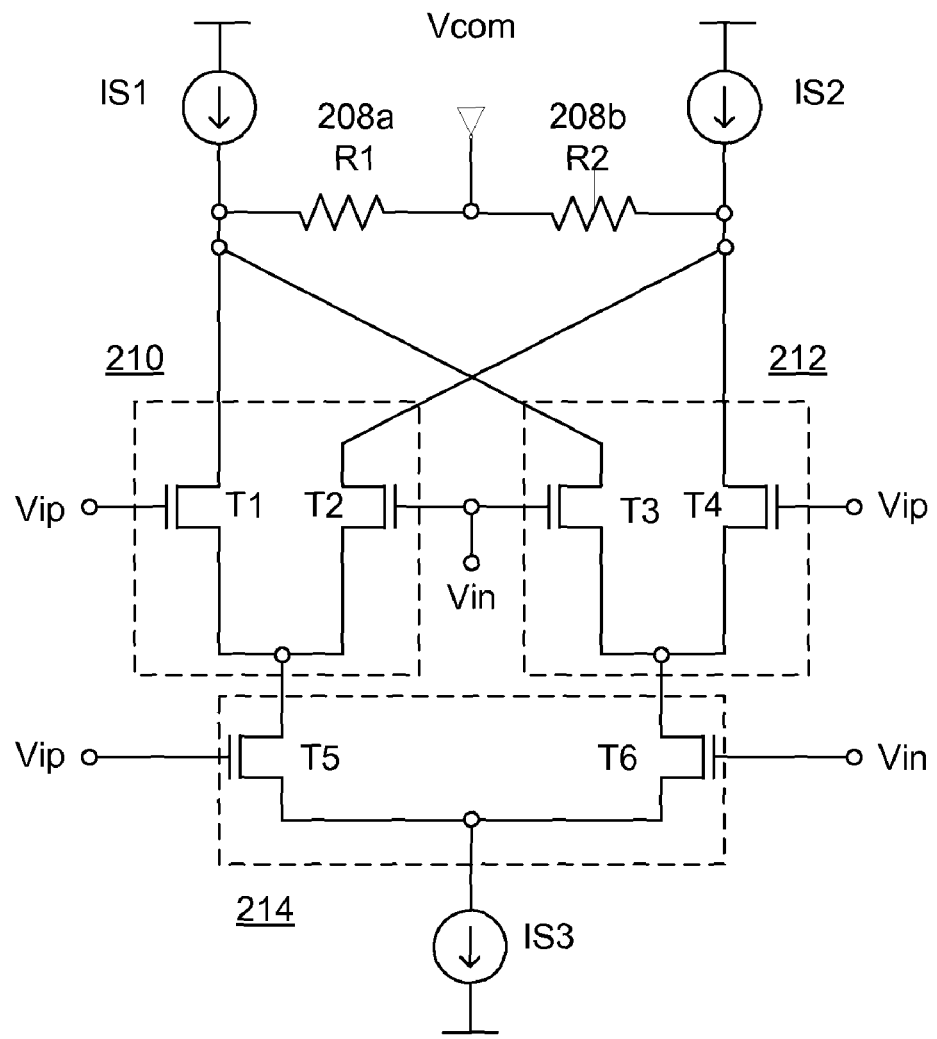
FIG. 2 depicts an example of a circuit for correcting the asymmetric signal using current sources.
Figure 3:
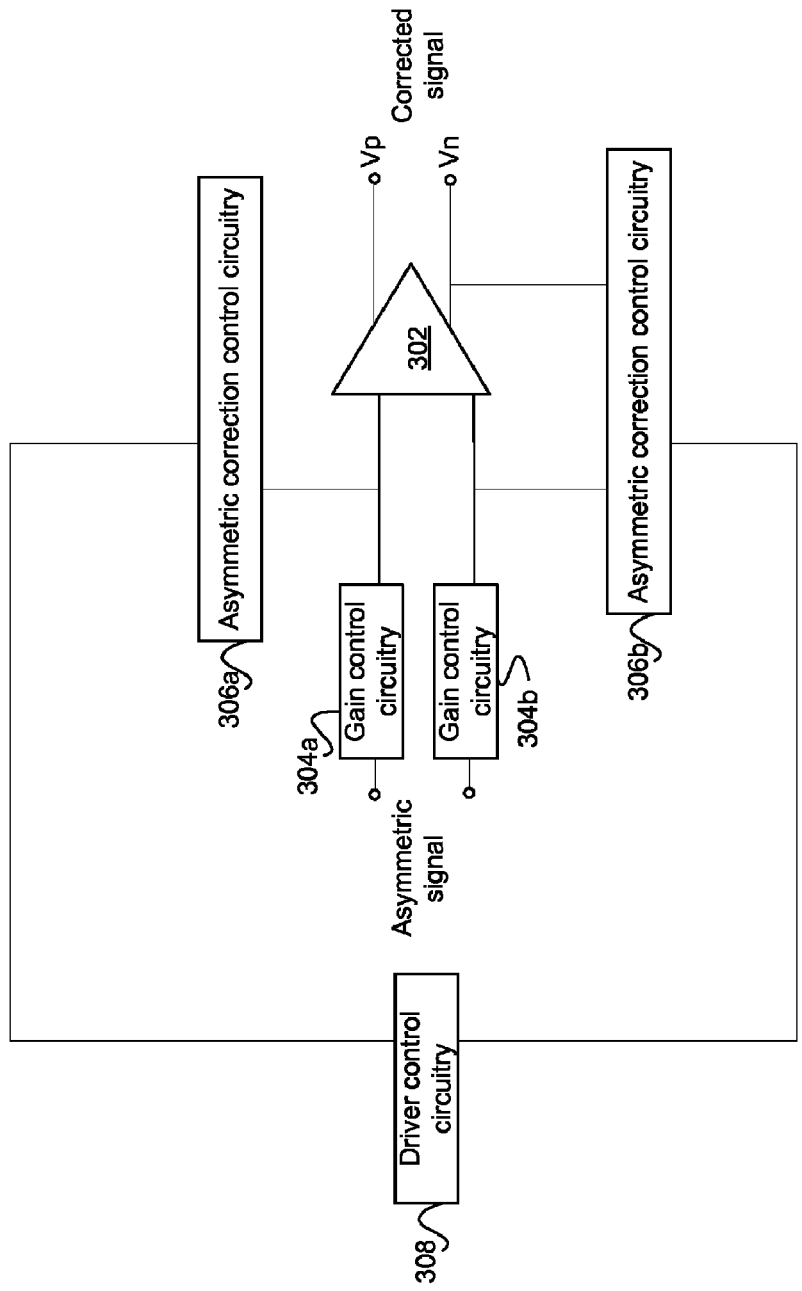
FIG. 3 depicts an example of a system for asymmetric correction according to one embodiment.

FIG. 3 depicts an example of a system 300 for asymmetric correction according to one embodiment. System 300 may be used in a read channel to process signals received from a read head of a hard disk drive (HDD). However, system 300 may be used in other applications where correction of an asymmetric signal is required. The asymmetric signal may be received from a pre-amplifier in the read channel. A corrected signal may then be output to an analog processor, such as an analog to digital converter (ADC).

The asymmetric signal may be received at a variable gain amplifier (VGA) 302. In one embodiment, the asymmetric signal may be a differential asymmetric signal. When used in this disclosure, asymmetric signal may refer to a differential version or a single-ended version.

Amplifier 302 corrects the asymmetry of the asymmetric signal to output the corrected signal at nodes Vn and Vp. The corrected signal is output by increasing or decreasing the gain of amplifier 302.

To adjust the gain, gain control circuitry 304a/b and asymmetric correction control circuitry 306a/b are used. Gain control circuitry 304a and asymmetric correction control circuitry 306a may process a positive asymmetric signal and gain control circuitry 304b and asymmetric correction control circuitry 306b may process a negative asymmetric signal.

Asymmetric correction control circuitry 306 is used to control gain control circuitry 304. For example, driver circuitry 308 may be used to control switches in asymmetric correction control circuitry 306. By controlling switches, a resistance ratio of between an input resistance and a feedback resistance may be adjusted in gain control circuitry 304a. By changing the ratio, the gain of amplifier 302 is adjusted, which corrects the asymmetry of the asymmetric signal.

Figure 4:
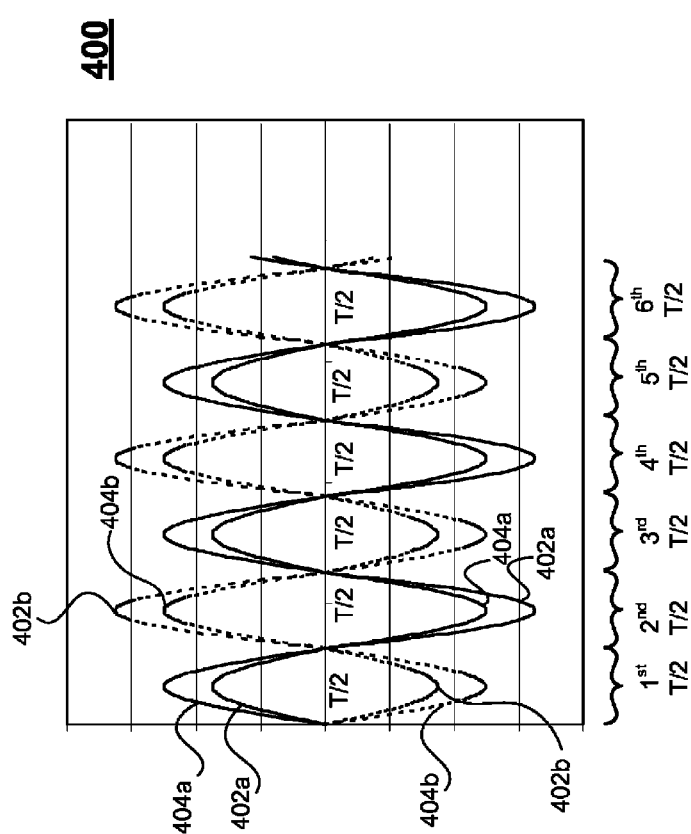
FIG. 4 shows an example of a graph showing a differential asymmetric signal according to one embodiment.

FIG. 4 shows an example of a graph 400 showing a differential asymmetric signal according to one embodiment. A positive asymmetric signal 402a and a negative asymmetric signal 402b form the differential asymmetric signal. Also, a positive ideal signal 404a and a negative ideal signal 404b are shown. To correct asymmetric signals 402a and 402b, the gain is boosted in the signal path for asymmetric signals 402a and 402b in odd half periods, e.g., a first T/2, a third T/2, a fifth T/2, and so on. This increases the amplitude of the asymmetric signal to be closer to the amplitude of ideal signals 404a and 404b, respectively. For example, as shown in the first T/2, the amplitude of asymmetric signal 402a is below that of ideal signal 404a and increasing the amplitude of asymmetric signal 402a corrects the symmetry of asymmetric signal. Also, asymmetric signal 402b may have the gain increased in the negative direction.

Also, the amplitude of asymmetric signal 402a and 402b is above the peak amplitude of ideal signal 404a in the even half periods. If the signal path gain is reduced for the even half periods, e.g., a second T/2, a fourth T/2, a sixth T/2, and so on, then asymmetric signals 402a and 402b have their amplitude reduced to be closer to the amplitude of ideal signals 404a and 404b.

Figure 5:
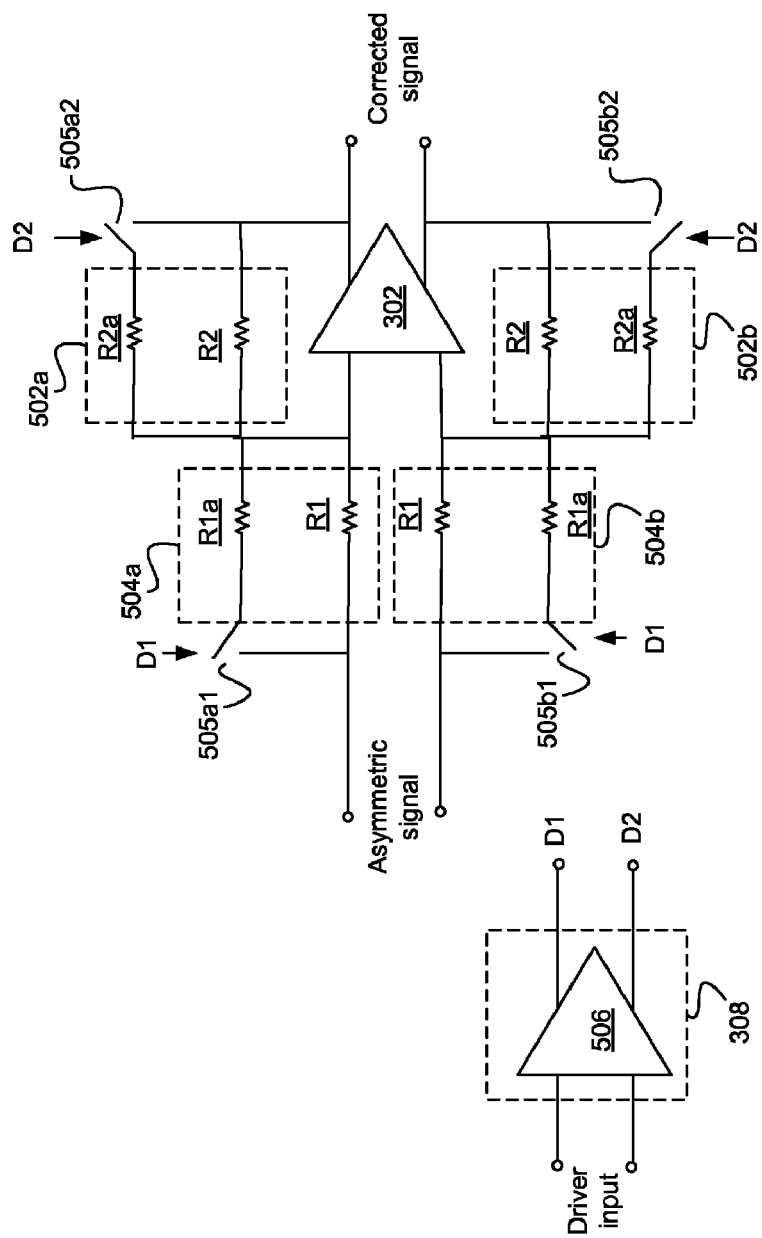
FIG. 5 depicts a more detailed example of a system for correcting asymmetry according to one embodiment.

FIG. 5 depicts a more detailed example of system 300 for correcting asymmetry according to one embodiment. Gain control circuitry 304a/304b may include input resistance circuitry 504a/504b and feedback resistance circuitry 502a/502b. Also, asymmetric correction control circuitry 306 may include switches 505a1/505b1 and 505a2/505b2. System 300 will be described with respect to the positive signal of a differential asymmetric signal; however, a person of skill in the art will recognize how the negative signal may be processed based on the teachings and disclosure described.

Driver circuitry 308 includes a driver 506, which controls switches 505. Switches 505 may be controlled to adjust the ratio of resistance between input resistance circuitry 504 and feedback resistance circuitry 502. By adjusting the ratio, the gain of amplifier 302 is adjusted such that correction of asymmetric signal 402 is performed.

The magnitude of asymmetry correction may be controlled by how much the gain is changed. For example, an analog-to-digital converter (ADC) may sample asymmetric signal 402 and determine how much gain adjustment is needed to correct asymmetric signal 402. A peak amplitude at a time for asymmetric signal 402 is compared to a peak amplitude for ideal signal 404 at that time. The amount of correction is then determined Gain control circuitry 304a is then adjusted to provide the determined gain. For example, a ratio of resistance for input resistance 504a and feedback resistance 502a is adjusted to adjust the gain of amplifier 302 to the desired amount.

To adjust the gain, different combinations of resistances are used in feedback resistance 502 and input resistance 504. Switch 505a2 is used to couple a resistor R2a to be in parallel to a resistor R2. Also, a switch 505a1 is used to couple a resistor R1a to be in parallel to a resistor R1. By coupling the resistor R2a to resistor R2, the feedback resistance is lowered. Also, by coupling a resistor R1a in parallel to a resistor R1, the input resistance is lowered. This may be used to change the resistance ratio for input resistance 504a and feedback resistance 502a.

One example of controlling switches 505a1 and 505a2 will now be described. Other ways of controlling switches may also be appreciated. Referring to FIG. 4, in the first T/2, the amplitude of asymmetric signal 402a is less than the amplitude of ideal signal 404a. To correct asymmetric signal 402a, the gain is increased. In one example, switch 505a1 is closed and switch 505a2 is opened. This causes input resistance 504a to be R1||R1a and feedback resistance 502a to be R2. The gain is:

$$\frac{RFeedback}{RInput} = \frac{R2}{R1||R1a}$$

where RFeedback is the resistance of feedback resistance 502a and RInput is the resistance of input resistance 504a. Because input resistance 504a is lowered due to the addition of resistor R1a in parallel with resistor R1, gain is increased (the gain when both switches 505a1 and 505b1 open is R2/R1). This corrects the asymmetry of asymmetric signal 402a.

In the second T/2, the amplitude of asymmetric signal 402a is greater than the amplitude of ideal signal 404a (in the negative direction). To correct asymmetric signal 402a, the gain is decreased. In one example, switch 505a1 is opened and switch 505a2 is closed.

This causes feedback resistance 502a to be R2∥R2a and input resistance 504a to be R1. The gain is:

$$\frac{RFeedback}{RInput} = \frac{R2\|R2a}{R1}$$

where RFeedback is the resistance of feedback resistance 502a and RInput is the resistance of input resistance 504a. Because feedback resistance 502a is lowered due to the addition of resistor R2a in parallel with resistor R2, gain is decreased. This corrects the asymmetry of asymmetric signal 402a.

The above process repeats itself for each period. For example, the third T/2 have switched controlled as described with respect to the first T/2 and the fourth T/2 have switches controlled as described with respect to the second T/2.

Driver 506 may be used as driver circuitry 308. Driver 506 receives driver input signal outputs a differential signal (D1 and D2) to drive switches 505. The polarity of the driver signals may change according to the asymmetric signal polarity. In one embodiment, when the square wave is high, switch 505a1 may be closed and switch 505a2 may be open. When the square wave is low, switch 505a1 may be opened and switch 505a2 may be closed.

Although the above structure was described, other implementations may be used to change the resistance ratio between output resistance 502a and input resistance 504a. Also, different types of devices for resistors R1, R1a, R2, R2a, and switches 505 may be used. For example, metal oxide semiconductor field effect transistors (MOSFETs) may be used. Although two parallel resistors are described for input resistance 504 and feedback resistance 502, X number of resistors in parallel may be used to provide different granularity of resistances (and thus gain), where X is an integer. For example, X number of switches in input resistance 504 may be opened or closed to achieve a desired input resistance and feedback resistance.

Figure 6:
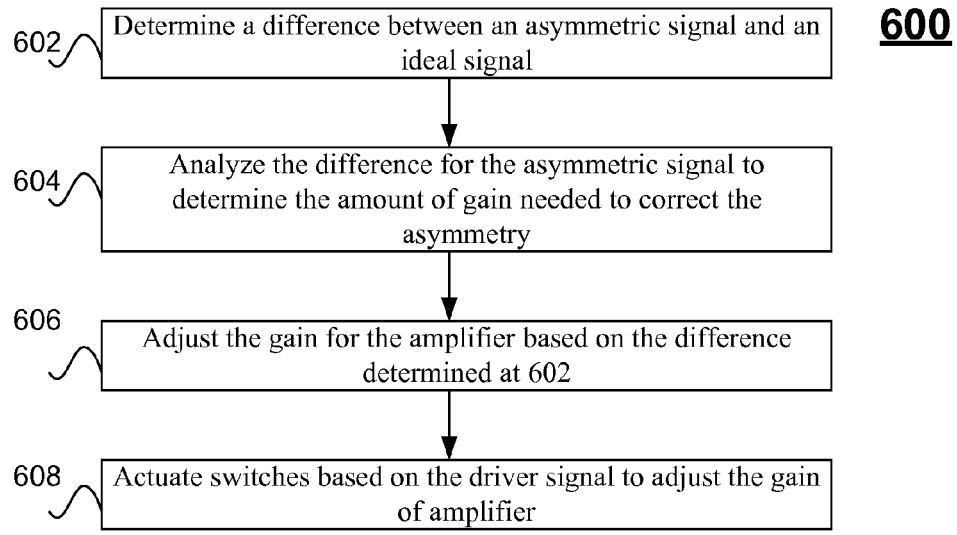
FIG. 6 depicts a simplified flowchart of a method for forming asymmetric correction according to one embodiment.

FIG. 6 depicts a simplified flowchart of a method for forming asymmetric correction according to one embodiment. At 602, a difference is determined between asymmetric signal 402 and ideal signal 404. For example, an ADC may sample asymmetric signal 402 and determine a difference between the sample and ideal signal 404 at a multiple times.

At 604, the difference is analyzed for asymmetric signal 402 to determine the amount of gain needed to correct the asymmetry.

At 606, the gain is adjusted for amplifier 302 based on the difference determined at 602. For example, the ratio of resistance between input resistance circuitry 604 and feedback resistance circuitry 602 is adjusted. In one example, a driver signal is adjusted based on the amount of gain determined at 604. For example, depending on the resistance desired, the driver signal is used to control a number of switches. In one example, a number of resistors may be coupled in parallel. Switches are controlled to couple a number of resistors in parallel to achieve the desired resistance. The driver signal may include multiple paths to control the switches. At 608, switches 505 are controlled based on the driver signal to adjust the gain of amplifier 302.

Accordingly, particular embodiments provide a way to adjust the asymmetry of a signal with a variable gain amplifier 302. The use of amplifier 302 provides higher bandwidth, lower distortion, and lower power. Also, particular embodiments may operate under a lower supply voltage condition. The lower power, lower distortion, and higher bandwidth may result because the correction is performed in amplifier 302 and external current sources or an external square wave generation circuit do not need to be used. Further, amplifier 302 may already be present in the read channel (it may have been used to amplify the signal but not correct the asymmetry).

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
an amplifier configured to receive an asymmetric signal;
gain control circuitry; and
correction control circuitry configured to control the gain control circuitry based on the asymmetrical signal to adjust a gain of the amplifier to correct the asymmetric signal, wherein a first adjustment of the gain control circuitry is performed during a first interval and a second adjustment of the gain control circuitry is performed during a second interval to correct the asymmetric signal.

2. The apparatus of claim 1, wherein the gain control circuitry comprises input resistance circuitry and feedback resistance circuitry.

3. The apparatus of claim 2, wherein the correction control circuitry adjusts a ratio of resistance between the input resistance circuitry to the feedback resistance circuitry.

4. The apparatus of claim 3, wherein an amount of ratio adjustment is based on an amount of change in gain needed to correct the asymmetric signal.

5. The apparatus of claim 4, wherein the change in gain is determined based on a comparison of the asymmetric signal to an ideal signal.

6. The apparatus of claim 2, wherein the correction control circuitry comprises a first switch coupled to the input resistance circuitry and a second switch coupled to the feedback resistance circuitry.

7. The apparatus of claim 6, wherein the correction control circuitry controls the first switch and the second switch to perform the first adjustment and the second adjustment.

8. The apparatus of claim 2, wherein:
the first adjustment lowers an input resistance of the input resistance circuitry; and
the second adjustment lowers the feedback resistance of the feedback resistance circuitry.

9. The apparatus of claim 1, further comprising a driver configured to control the correction control circuitry to perform the first adjustment and the second adjustment.

10. The apparatus of claim 1, wherein the asymmetric signal comprises a differential asymmetric signal, wherein the correction control circuitry is configured to control the gain adjustment circuitry based on the differential asymmetrical signal to change a differential gain of the amplifier to correct the differential asymmetric signal.

11. The apparatus of claim 1, wherein the amplifier is located in a read channel for a hard disk drive.

12. The apparatus of claim 1, wherein the gain control circuitry is coupled to the amplifier.

13. The apparatus of claim 1, wherein the first interval comprises a first half period and the second interval comprises a second half period.

14. A system comprising the apparatus of claim 1, the system further comprising:
a pre-amplifier configured to receive the asymmetrical signal from a read head of a hard disk drive, wherein the pre-amplifier is configured to send the asymmetric signal to the amplifier.

15. A method comprising:
receiving an asymmetric signal at an amplifier;
adjusting the gain of the amplifier to correct the asymmetric signal to produce a corrected signal, wherein a first adjustment of gain control circuitry is performed during a first interval and a second adjustment of the gain control circuitry is performed during a second interval to correct the asymmetric signal; and
outputting the corrected signal.

16. The method of claim 15, wherein adjusting the gain comprises adjusting an input resistance and a feedback resistance.

17. The method of claim 16, wherein:
the first adjustment lowers the input resistance; and
the second adjustment lowers the feedback resistance.

18. The method of claim 16, wherein a ratio of resistance between the input resistance circuitry to the feedback resistance is adjusted.

19. The method of claim 18, wherein an amount of ratio adjustment is based on an amount of change in gain needed.

20. The method of claim 19, wherein the change in gain is determined based on a comparison of the asymmetric signal to an ideal signal.

21. The method of claim 15, wherein the first interval comprises a first half period and the second interval comprises a second half period.

22. The method of claim 15, wherein the asymmetric signal comprises a differential asymmetric signal, wherein adjusting comprises adjusting a differential gain of the amplifier to correct the differential asymmetric signal.

* * * * *